United States Patent [19]

Gilson et al.

[11] Patent Number: 4,564,817

[45] Date of Patent: Jan. 14, 1986

[54] MONOLITHIC IMPEDANCE MATCHED CASCADE AMPLIFIER

[75] Inventors: Russell A. Gilson, Ocean; Thomas F. Burke, Toms River, both of N.J.

[73] Assignee: The United States of America as represented by the Secretary of the Army, Washington, D.C.

[21] Appl. No.: 616,091

[22] Filed: Jun. 1, 1984

[51] Int. Cl.[4] ............................................. H03F 3/60
[52] U.S. Cl. .................................. 330/286; 330/277; 330/54
[58] Field of Search ................... 330/53, 54, 277, 286, 330/307; 357/41

[56] References Cited

U.S. PATENT DOCUMENTS 4,486,719 12/1984 Ayasli .................................. 330/54

Primary Examiner—James B. Mullins
Assistant Examiner—G. Wan
Attorney, Agent, or Firm—Anthony T. Lane; Jeremiah G. Murray; Edward Goldberg

[57] ABSTRACT

An integrated amplifier circuit for monolithic fabrication is disclosed. The circuit includes a plurality of amplifier stages between an input transmission line and an output transmission line. Each stage includes a FET formed on the surface of a semi-insulating substrate such as gallium arsenide (GaAs). The gate of each FET is connected to the input transmission line, while the drain is connected to the output transmission line. The source is connected through the semi-insulating substrate to a conductive layer. A received signal propagates as a traveling wave along the input transmission line, and is amplified by each of the FETs. The phase delay between the gates is the same as that between the drains, so that the amplified signal adds constructively on the output transmission line. Each of the transmission lines is terminated in its own characteristic impedance, which may be equal to the load.

8 Claims, 11 Drawing Figures

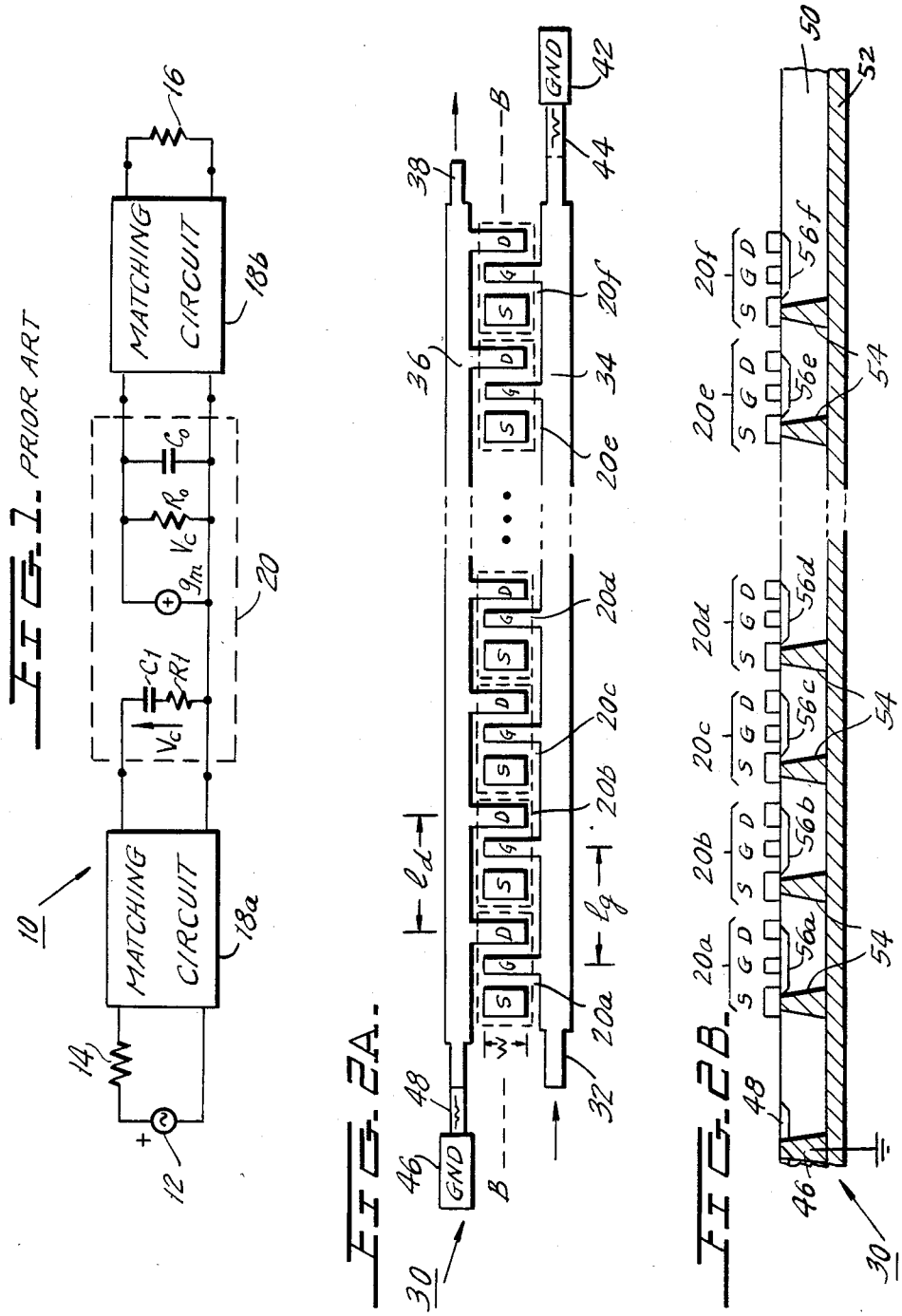

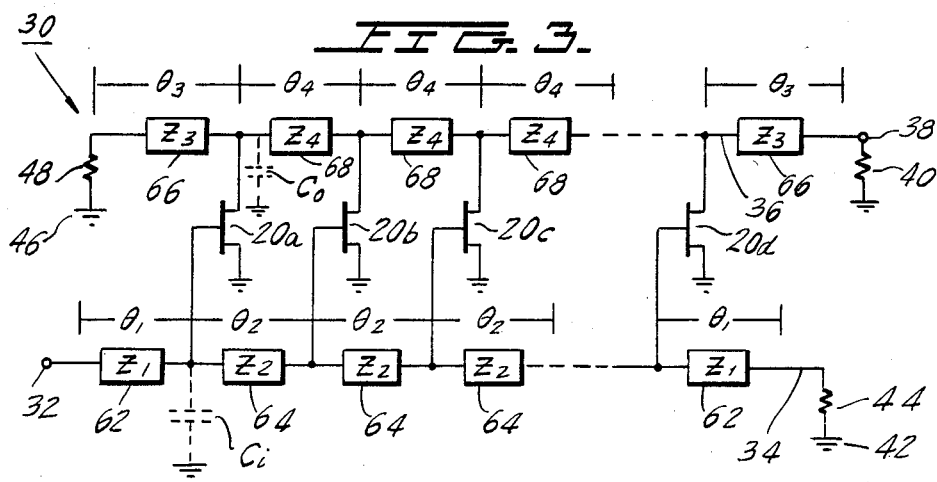
FIG. 3.
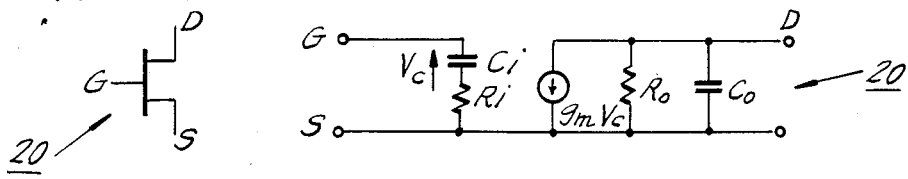
FIG. 4A. PRIOR ART
FIG. 4B. PRIOR ART
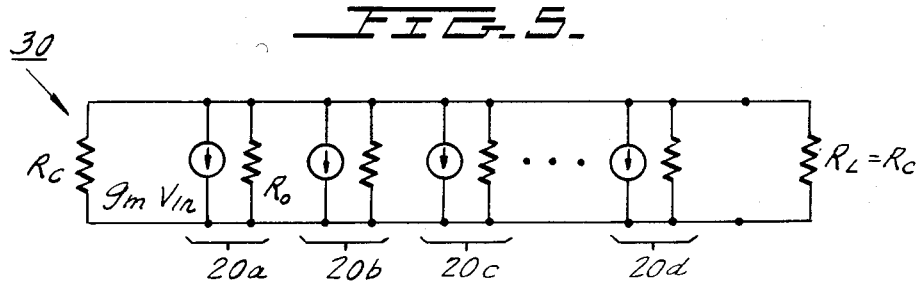
FIG. 5.
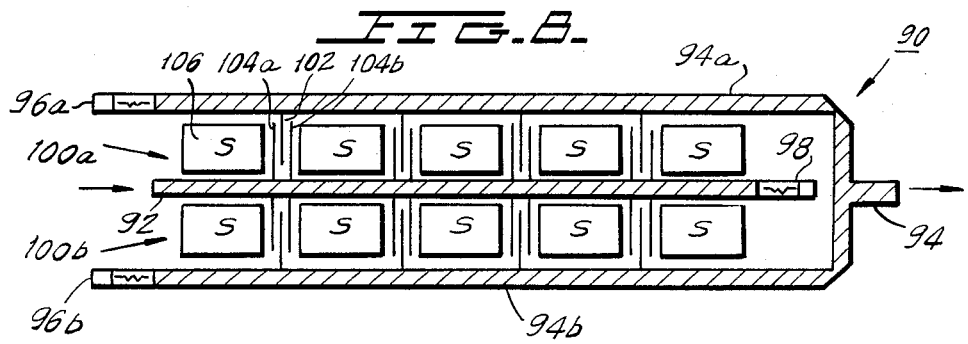
FIG. 8.

MONOLITHIC IMPEDANCE MATCHED CASCADE AMPLIFIER

The invention described herein may be manufactured, used and licensed by or for the Government for Governmental purposes without the payment to me of any royalties thereon.

BACKGROUND OF THE INVENTION

1. Field of the Invention

The invention relates to electronic circuitry for amplifying signals. More specifically, the invention relates to a monolithic circuit which may be fabricated on a substrate and which operates as an amplifier.

2. Description of the Prior Art

Electronic circuits for amplifying signals have long been known. Specifically, circuits are known for amplifying electrical signals at microwave frequencies. A typical small signal microwave amplifier, for example, includes an active device such as a field effect transistor (FET), with input and output impedance matching circuits. The fundamental design constraints on such an amplifier are that it provide a specified gain over a specified frequency bandwidth.

The active device, such as a FET, provides gain, and it is well known that maximum gain is obtained when the input and output impedances of the device are conjugately matched. On the other hand, the input and output impedances are complex, having both resistive and reactive components, so that the input and output impedances vary with frequency. Therefore, the input and output impedances cannot be matched at all frequencies, and some impedance mismatching between the input and output of the active device is necessary to obtain a specified bandwidth. As a result, the gain of the active device will be less than its maximum, which is not especially troublesome due to the high maximum available gain of FET devices.

The mismatched impedances at the input and output of an active device can be troublesome, however, if several such devices are connected together as cascaded amplifying stages. The difference between the output impedance of one stage and the input impedance of the next stage will cause signal reflections, resulting in signal attenuation and high gain ripple. This problem will also occur if the output impedance of the signal source does not match the input impedance of the first stage. To minimize the problems caused by signal reflection, isolators may be connected between amplifier stages, or hybrid amplifiers having balanced stages may be used. Isolators and hybrid amplifiers, however, are not amenable to monolithic fabrication, precluding a monolithic cascaded amplifier on a substrate.

A similar problem results at the output of a cascaded amplifier, because the load must be transformed to the high output resistance, roughly 200-600 ohms, of an FET device. At microwave frequencies, the elements which would be necessary to transform the load cannot be realized, so that a compromise must again be made between load matching and gain, resulting in lower gain.

It would be advantageous to provide an electronic amplifier circuit which would permit cascading directly, rather than with isolators or by balancing stages. It would also be advantageous to have an amplifier which could be fabricated in monolithic form on a substrate, permitting batch fabrication, which would result in lower cost, higher reliability, and reductions in size and weight as great as several orders of magnitude. It would also be advantageous to provide such an amplifier with a simple configuration requiring no critical tuning elements for broad band gain. It would also be advantageous to provide such an amplifier with a very small impedance mismatch across a wide bandwidth.

SUMMARY OF THE INVENTION

The monolithic amplifier of the invention achieves these and other advantages by providing directly cascaded amplifiers in monolithic form on a substrate. The monolithic amplifier of the invention operates as a traveling wave FET amplifier resulting in a simple integrated circuit.

The monolithic or integrated amplifier of the invention includes a plurality of amplifier stages. These stages may be FET devices on a gallium arsenide (GaAs) substrate. Two parallel transmission lines may be provided, one for the propagation of an input signal and the other for the propagation of the amplified signal. The FET devices may be arranged between the transmission lines, with the gate of each FET device connected to the input transmission line and the drain of each FET device connected to the output transmission line. The source of each FET device may be connected to a conductive grounding layer by a conductive material in a hole through the substrate. In addition, the distances between corresponding gates and drains should be such that the phase delay of the input signal between two successive gates is equal to the phase delay of the amplified signal between the corresponding drains.

Alternatively, the output transmission line may be divided into two branches parallel to the input transmission line, with one branch on each side of the input transmission line. In this case, the amplifier stages will be divided into two rows, one of the rows being between each of the branches and the input transmission line.

The integrated amplifier circuit of the invention and the monolithic amplifier in which it is included may be batch fabricated, resulting in low cost, high reliability, and size and weight reductions as great as several orders of magnitude. In addition, the amplifier has an extremely simple configuration permitting direct cascading of amplifier stages, so that no critical tuning elements are required for broadband gain. As a result, the amplifier may be used in communications, radar and electronic warfare equipment in which high gain broadband intermediate frequency and baseband amplifiers are required.

Other objects, features and advantages of the invention will be apparent from the following description, together with the accompanying drawings and the appended claims.

BRIEF DESCRIPTION OF THE DRAWINGS

FIG. 1 is a schematic diagram illustrating the electrical characteristics of a conventional small signal microwave amplifier.

FIG. 2A is a top plan view of the integrated amplifier circuit of the invention in monolithic form.

FIG. 2B is a cross-sectional view of the amplifier circuit of FIG. 2A, taken along line B—B.

FIG. 3 is a schematic diagram showing the electrical characteristics of the amplifier circuit of FIG. 2A.

FIG. 4A is a schematic diagram showing the conventional designations of FET terminals.

FIG. 4B is a simplified schematic diagram of an equivalent circuit for a field effect transistor.

FIG. 5 is a simplified schematic circuit diagram based on the circuit of FIG. 3.

FIG. 8 is a top plan view of an alternative embodiment of the integrated amplifier circuit of the invention in monolithic form.

DETAILED DESCRIPTION OF THE PREFERRED EMBODIMENTS

I. General Description

Figure 6A:
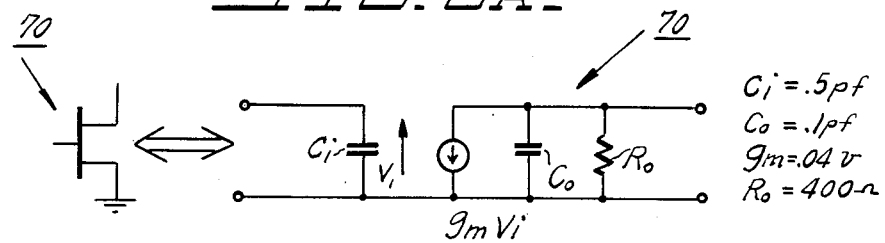
FIG. 6A is a simplified schematic diagram showing the actual parameters of a field effect transistor.

The integrated amplifier circuit of the invention may be understood by comparing the conventional circuit shown in FIG. 1 with the top plan view of one embodiment of the invention in FIG. 2A.

The conventional small signal microwave amplifier 10 is driven by a signal source 12 through input resistance 14. The amplifier in turn drives a load 16. The signal source is connected to the amplifier circuit through a matching circuit 18a, and the amplifier is connected to the load 16 through another matching circuit 18b. The amplifier itself, in the example shown in FIG. 1, is a field effect transistor 20, which may be modeled as shown for small signals.

As discussed above, in order to obtain a specified bandwidth from FET 20, the gain must be reduced from the maximum. This is ordinarily done by impedance mismatching of the input and output of FET 20, as the maximum gain occurs when the input and output impedances are conjugately matched. The input impedance matching circuit 18a serves to match the impedance of FET 20 to that of signal source 12 and resistance 14. The output matching circuit 18b matches the output resistance of FET 20 to that of the load 16. Because the output resistance of FET 20 may be as high as 200-600 ohms, output matching circuits at microwave frequencies for typical loads may not be possible, so that the gain must be reduced further to obtain matching.

More specifically, when the conventional amplifier circuit 10 of FIG. 1 is cascaded, input and output matching circuits 18a, 18b must be used in each stage to match the output impedance of a preceding amplifier stage and the input impedance of a following amplifier stage, respectively. In addition, to minimize signal attenuation and high gain ripple due to signal reflections caused by mismatch, isolators (not shown) must be used between stages or stages of the amplifier must be balanced, as discussed above.

FIG. 2A shows a top plan view of the integrated amplifier circuit 30 of the invention. Like a cascaded amplifier constructed from conventional amplifier 10, the integrated amplifier circuit 30 includes a plurality of amplifier stages 20a-20f. Each of these stages is an FET like FET 20 in FIG. 1. Unlike the conventional amplifier 10, however, integrated amplifier 30 has no impedance matching circuits. Instead, the structure of amplifier 30 ensures the impedance matching of the amplifier stages 20a-20f, so that amplifier 30 may be monolithically fabricated as a single integrated circuit.

The operation of integrated amplifier circuit 30 illustrates why impedance matching is unnecessary. A signal to be amplified is received at input 32 and propagates as a traveling wave along input line 34, providing the signal successively to the inputs of all of the amplifying stages 20a-20f. After amplification, each of the amplifying stages 20a-20f provides the amplified signal at its output to the output transmission line 36. The amplified signal then propagates as a traveling wave along transmission line 36 to output 38, from which it may be connected to a load (not shown). In addition, both the input and output transmission lines 34, 36 are connected to a respective ground 42, 46 through a respective terminating impedance 44, 48, which prevents reflections along the transmission lines 34, 36. Therefore, the structure of integrated amplifier circuit 30 ensures that the amplifying stages are impedance matched and require no additional matching circuits. In addition, the input transmission line is matched to the input across a wide bandwidth, permitting direct cascading of amplifier circuits.

Although the integrated amplifier circuit of applicants' invention permits monolithic fabrication, a number of specific amplifier circuits could be used to realize the invention. The simple embodiment shown in FIG. 2A and the more complex embodiment shown in FIG. 8 are discussed in greater detail below.

II. First Embodiment

A. Structure

In order to provide the integrated amplifier circuit 30 of the invention, amplifier stages 20a-20f, shown in FIGS. 2A and 2B, are provided on the surface of substrate 50. Amplifier stages 20a-20f are arranged successively in a row, with input transmission line 34 along one side of the row and output transmission line 36, parallel to transmission line 34, on the other side of the row. As shown in both FIGS. 2A and 2B, each FET 20a-20f includes a source S, a gate G and a drain D. In the embodiment shown in FIG. 2A, input transmission line 34 is connected to each of the gates G, while output transmission line 36 is connected to each of the drains D. Therefore, input transmission line 34 could be designated the gate line, while output transmission line 36 could be designated the drain line. As shown in FIG. 2A, the distance $l_g$ between the gates G of successive FETs 20a and 20b is equal to the distance $l_d$ between the drains D of those FETs. If necessary, however, the distances $l_g$ and $l_d$ can be of different lengths to accommodate designs in which the input capacitance ($C_i$) and output capacitance ($C_o$) of each FET are unequal. FIGS. 2A and 2B are not strictly to scale, however, because $l_g$ will ordinarily be much longer than the longitudinal widths of the gates G and drains D, which are exaggerated for illustrative purposes. Also, the transverse width w of the terminals of the FETs 20a-20f is much smaller than distance $l_g$, so that FIG. 2A similarly exaggerates the width w for illustrative purposes.

The detailed structure of FETs 20a-20f can be better understood from FIG. 2B. As shown there, a substrate 50 has an outer surface on which the FETs 20a-20f are integrated. Substrate 50 also has an inner surface toward a conductive layer 52, which may be a conductive layer of metal. In addition, the source S of each of the FETs 20a-20f is connected to conductive layer 52 by a conductive material 54 in a respective hole through substrate 50.

Substrate 50 is preferably semi-insulating GaAs. This prevents leakage of power from gate and drain transmission lines 34 and 36 into substrate 50. Because substrate 50 forms a high quality dielectric, the gate and drain transmission lines 34 and 36 and the other components on the outer surface of the substrate are isolated, so that no additional isolation capacitance is required.

The first part of each FET to be formed on the outer surface of the substrate 50 is the channel 56. As shown in FIG. 2B, each of FETs 20a-20f has a corresponding channel 56a-56f. Each channel 56 may be formed in a number of ways. For example, each channel may be formed by implanting a semi-conductive layer in the desired location or by implanting a sheet and etching away the parts of the sheet other than the channel using photolithographic methods. Alternatively, the channels 56 may be formed by vapor phase or molecular beam epitaxial (MBE) growth, together with an oxygen implant in the areas around the channel to eliminate conductivity. Similar methods may be used to create the input and output terminating impedances 44 and 48. As shown in FIG. 2B, impedance 48 is formed in a location such that it is connected to conductive layer 52 by ground 46, which is a conductive material in a hole.

The sources S, gates G, drains D and gate and drain transmission lines 34 and 36 may be formed by applying metal with photolithographic methods. Specifically, each gate G may be formed directly on the respective channel 56, creating a Schottky barrier junction. Rather than etching the metal, a lift-off technique may be used in which the metal is applied over a layer of photoresist which has been masked and removed from the areas in which metal is desired. In the other areas, the metal which is applied can be removed or lifted off with the photoresist on which it is deposited. In addition, other appropriate methods for providing an integrated circuit on a substrate could be used.

The gate and drain transmission lines 34 and 36 created as described above will each have a characteristic impedance determined by several factors including the width of the line, its height or separation from the conductive layer 52, and the dielectric constant of substrate 50. In order to avoid reflections, input and output terminating impedances 44 and 48 should be equal to the effective characteristic impedance of the gate and drain transmission lines 34 and 36. Although the gate and drain transmission lines 34 and 36 could have different characteristic impedances, it will be assumed for purposes of explanation that both have a characteristic impedance of $R_c$. For complete matching, the input signal and load (not shown) should also each have an impedance of $R_c$. It is important to note, however, that this characteristic impedance $R_c$ will be different from the characteristic impedance of the lines of length $l_g$ and $l_d$ connecting the gates G and drains D, respectively, because of the capacitive loading by the respective FETs 20a-20f. As discussed below, each of the FETs will have a characteristic upper cutoff frequency equal to $\frac{1}{2} R_i C_i$ at its input. For frequencies below this cutoff frequency, the input of each FET will be primarily capacitive and the input or gate transmission line 34 may be designed as if this capacitance were in the transmission line. As discussed below, the gate and drain transmission lines will also have an upper cutoff frequency of 1/LC, which will be designed to be less than the FET cutoff frequency.

The electrical structure of the integrated amplifier circuit 30 of FIGS. 2A and 2B can be more fully understood from FIG. 3, which shows a schematic electrical circuit diagram of integrated amplifier circuit 30. FIG. 3 shows gate and drain transmission lines 34 and 36 analyzed into distinct sections, each having a given impedance. Gate transmission line 34 may be analyzed into input and terminating sections 62 each having impedance $Z_1$ and intermediate sections 64 having impedance $Z_2$. Drain transmission line 36 may be analyzed into terminating and output sections 66 having impedance $Z_3$ and intermediate sections 68 having impedance $Z_4$. Assuming that the transmission lines 34 and 36 are lossless, the input signal will propagate along gate transmission line 34 at a constant amplitude but with a different phase at each gate G of one of the FETs 20a-20d. No reflection should occur from terminating impedance 44, since it is equal to the characteristic impedance $R_c$ of transmission line 34. Reflection from the input 32 should also be minimal if the gate line 34 is properly designed as if it included the input capacitance $C_i$ of the FETs 20a-20d, as shown in dotted line in FIG. 3. Similarly, the amplified signal on drain transmission line 36 should have constant amplitude but different phase at each drain D.

The desired electrical structure may be achieved with many different designs. As described below, however, several specific design parameters have primary importance in the design of integrated amplifier circuit 30.

B. Design

The structure described above can only be obtained if the integrated amplifier circuit 30 is properly designed. The specific dimensions and other characteristics of the integrated amplifier circuit 30 of FIG. 2A or of any other embodiment of the invention may be determined using a transmission line model for the gate and drain transmission lines 34 and 36.

If a transmission line is modeled as a series of inductors L separated by shunting capacitors C, the characteristic impedance of the transmission line $Z_O$ may be expressed as:

$$Z_O = L/C \tag{1}$$

Similarly, the high end or upper cutoff frequency $f_c$ for a low pass transmission line may be expressed as:

$$f_c = 1/LC \tag{2}$$

As discussed below, Equations 1 and 2 can be applied to the design of the gate and drain transmission lines 34 and 36.

A variety of design parameters may be considered in designing the integrated amplifier circuit 30 of the invention. As a practical matter, however, the design parameters which control the design of each line are the actual impedance of the transmission line considered alone; the input or output capacitance of the FETs connected to the transmission line; the overall characteristic impedance of the transmission line, taking into account its own characteristic impedance together with the impedance resulting from the connection to the FETs; the upper cutoff frequency of the FETs; the upper cutoff frequency of the transmission line, which determines the bandwidth; and the transconductance of the FETs necessary to obtain the desired gain.

In order to illustrate the process of designing the circuit, we will discuss how a design would proceed, given the characteristics of the FETs to be used and given a desired bandwidth. The upper cutoff frequency of the gate transmission line 34, which effectively determines the bandwidth of the circuit, must be less than the upper cutoff frequency of the FETs, $\frac{1}{2} R_i C_i$ on the input side. Otherwise, energy will be lost in the FETs 20 whenever the frequency on the gate transmission line 34 exceeds their cutoff frequency. Assuming that the upper cutoff frequency of the FETs permits the desired bandwidth, the FET capacitance can then be used in Equations 1 and 2, together with the desired bandwidth, to obtain the impedance of each transmission line separately. From the desired impedance for each transmission line, the specific dimensions of that transmission line may then be determined. If the FETs to be used have unequal input and output capacitances $C_i$ and $C_o$, a capacitance may be added connected to the appropriate terminal of each FET to equalize the capacitances seen by the transmission lines. This allows a design in which the lengths $l_g$ and $l_d$ are equal.

A similar process to that set forth above could be followed if a desired characteristic impedance $R_c$ were given. $R_c$ could be substituted for $Z_O$ in Equation 1 as necessary to obtain values for other parameters.

To a good approximation, each section of the gate and drain transmission lines 34 and 36 between connections to the FETs 20 has no capacitance, and therefore, from Equation 2, has a wide bandwidth. Connecting the transmission lines 34 and 36 to the FETs 20, however, results in a much narrower bandwidth, because the capacitance of each of the FETs 20 loads the line. As a result, it is necessary to calculate the dimensions of the transmission line sections while taking full account of the loading by the FETs. This will typically be done using a programmed computer, and the most common program for performing these calculations for a microwave transmission line is Supercompact. The Supercompact program is capable of taking the distributed inductance and capacitance of the transmission line into account, and can indicate the relevant parameters of the desired transmission line including the width and thickness of the conducting strip, the thickness of the ground plane, the width and length of the lines connected to the FETs, and other parameters.

Once a working design has been made, it can be changed in several basic ways to obtain additional designs. For example, the bandwidth $f_c$ could be modified by changing the number of FETs 20 or by selecting FETs 20 having a different capacitance. Similarly, the gain resulting from the integrated amplifier circuit 30 may be adjusted by selecting FETs 20 having the appropriate transconductance $g_m$, discussed in greater detail below. As a rule, the transconductance of a FET is proportional to its size, so that if the size of the FETs is doubled, their transconductance will also double.

When an integrated amplifier circuit 30 has been designed and manufactured as described above, it will include a plurality of amplifier stages between two transmission lines. We turn now to the detailed operation of the integrated amplifier circuit 30 constructed in this manner.

C. Operation

If the transmission lines are properly designed, as set forth above, the signal and the amplified signal will propagate along each of the respective transmission lines in a predictable manner. As illustrated in FIG. 3, the input transmission line may be modeled as a series of sections 62 and 64, the first and last of which have impedances of $Z_1$, and the intermediate ones of which have impedances of $Z_2$. Between each pair of sections 62 and 64 is connected one of the FETs 20a–20d, which is approximately equivalent to shunting with a capacitance $C_i$, shown in dotted line for only one of the FETs 20. The resulting gate transmission line will have a narrower bandwidth as a result of a capacitances $C_i$, as taken into account in the design process. Similarly, the drain transmission line will behave as if a capacitance $C_O$ were connected between each of the sections 66 and 68, as shown in dotted line for one of the FETs 20.

If the gate and drain transmission lines 34 and 36 are properly fabricated, they will be nearly lossless, so that a signal or amplified signal propagating down the respective transmission line 34 or 36 will maintain a nearly constant amplitude, changing only in phase. The phase difference between successive connections to gates G or drains D will depend on the phase velocity and the length $l_g$ of the transmission line segments between connections. If the design approach outlined above is followed, each of the segments in each of the transmission lines will have the same length $l_g$.

FIG. 4A illustrates the conventional designation of terminals of a FET 20, and FIG. 4B is the conventional small signal model of a FET. As indicated, the drain current will be the product of the gain factor or transconductance $g_m$ of the FET and the source to gate voltage, $V_c$. As a result, an input signal voltage $V_{in}$ on the gate transmission line 34 of FIG. 3 will produce an output current from the nth FET of:

$$I_n = g_m |V_{in}| e^{j\theta_n} \quad (3)$$

In Equation 3, $\theta_n$ is the phase of the signal voltage at the gate $G_n$. If the phase delay between successive drains D is equal to that between successive gates G, the drain currents $I_n$ will add constructively to produce gain.

To show that the amplifier circuit 30 of FIG. 3 will produce gain, an analysis could be performed at microwave frequencies using a computer program. A good approximation can be obtained by performing the calculation at low frequencies, however, because the response of the amplifier circuit 30 extends to DC. In this approximation, the phase difference in the signal voltage at the gates G and at the drains D will be neglected as negligible for low frequencies. Similarly, the capacitance $C_i$ and $C_o$ will be neglected as negligible at low frequencies. Applying the small signal model of FIG. 4B, a low frequency model for the drain side of the circuit is shown in FIG. 5. As illustrated, each of the FETs 20a–20d may be modeled as a current source providing a current of $g_m V_{in}$ and a resistance $R_o$. Terminating impedance 48 is shown as a resistance $R_c$, and load 40 is similarly shown as a resistance $R_L$ equal to $R_c$. The analysis of the circuit can be based on the observation that when N identical devices are connected to a load, $R_L$, each device sees an effective load resistance given by:

$$R_{Leff} = NR_L \quad (4)$$

In this amplifier, however, the drain transmission line 36 is terminated at each end in an equal load $R_L$, reducing the effective load to $R_L/2$, so that:

$$R_{Leff} = NR_L/2 \quad (5)$$

Using the effective load from Equation 5, the voltage gain $A_V$ of each FET can be calculated to be:

$$A_V = Ng_m(R_oR_L/(NR_L+2R_o)) \qquad (6)$$

In Equation 6, $R_o$ is the output resistance of each FET. Since the power varies as the square of the voltage, the power gain $G_P$ is:

$$G_p = (Ng_m R_o R_L/(NR_L+2R_o))^2 \qquad (7)$$

Although these calculations are based on a low frequency approximation, it can be shown by a computer simulation that the resulting values for voltage gain $A_V$ and power gain $G_p$ extend to the cutoff frequency of the transmission line if the FET cutoff frequency is considerably higher. The circuit simulated is shown in FIGS. 6A and 6B, and the results of the simulation are shown in FIG. 7.

Figure 6B:
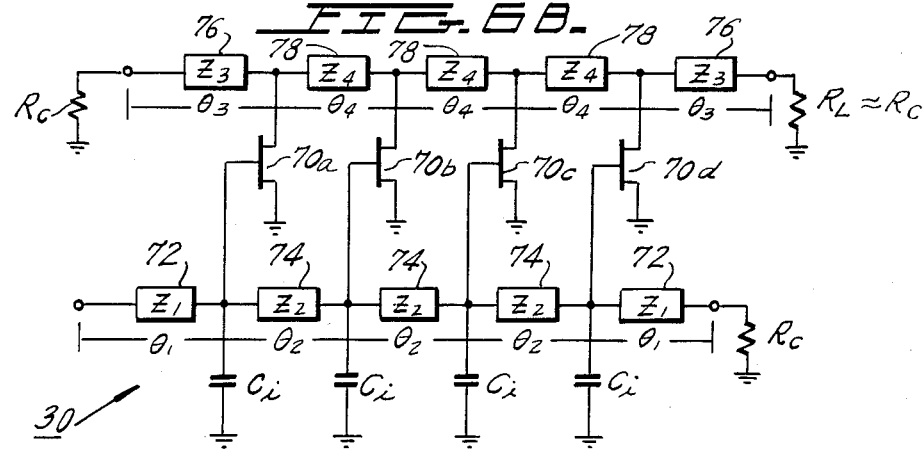
FIG. 6B is a schematic electrical diagram of a simple embodiment of the invention having the parameters shown in FIG. 6A.

As shown in FIG. 6A, the FET 70 to be used in the simulation has an input capacitance $C_i$ of 0.5 pf, an output capacitance $C_o$ of 0.1 pF, a transconductance $g_m$ of 0.04 mhos, and an output resistance $R_o$ of 400 ohms. The simulated circuit, as shown in FIG. 6B, includes four FETs 70a–70d, each having the above characteristics. In addition, the gate transmission line includes the end sections 72 having an impedance $Z_1$ of 40.9 ohms with an equivalent phase delay $\theta_1$ of 119°. The intermediate sections 74 each have an impedance $Z_2$ of 70.4 ohms and a phase delay $\theta_2$ of 63.7°. The drain transmission line includes end sections 76 having an impedance $Z_3$ of 69.6 ohms and an equivalent phase delay $\theta_3$ of 69.4°. The intermediate sections 78 have an impedance $Z_4$ of 91.6 ohms and a phase delay $\theta_4$ of 65.2°. All of these phase delays $\theta_1$–$\theta_4$ are calculated at 10 GHz. In addition, the gate transmission line was terminated in a resistance $R_c$ of 50 ohms, and the drain transmission line was connected between a terminating impedance $R_c$ and a load impedance $R_L$ both equal to 50 ohms.

Figure 7:
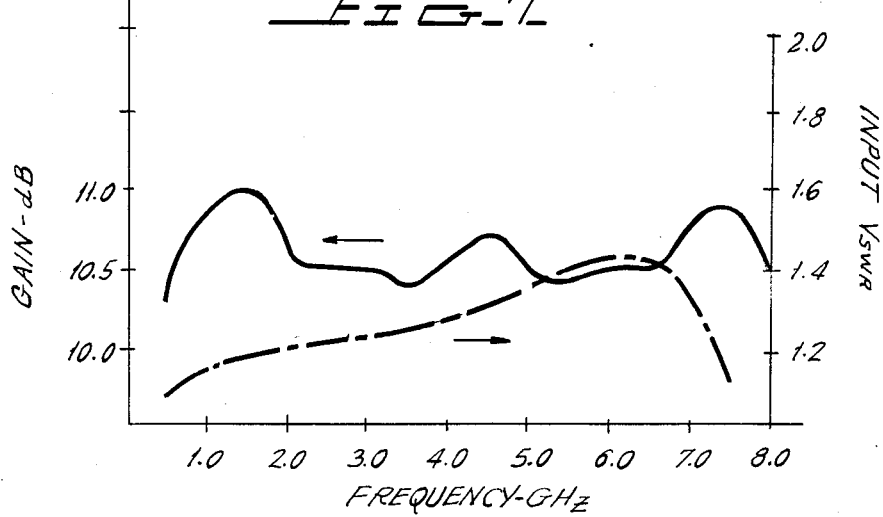
FIG. 7 is a graph showing the performance of the circuit of FIG. 6B.

Based on the above specific parameters, the amplifier performed as shown in FIG. 7. As can be seen, a relatively flat gain between 10.0 and 11.0 dB was obtained from near DC to 8 GHz. The input impedance expressed as the voltage standing wave ratio (VSWR) remained fairly stable across the entire bandwidth, and also remained close to the characteristic impedance $R_c$ of 50 ohms. The computer simulation showing a gain of 10.0–11.0 dB agrees well with the low frequency power gain calculated from Equation 7, above, which is 10.1 dB.

The computer simulation demonstrates that the integrated amplifier circuit 30 of FIG. 3 has a matched input even though the individual FETs 20a–20f are not matched to each other. Furthermore, the load transformation given in Equation 5 depends only on the number of FETs being combined, rather than on critical elements like isolators or impedance matching circuits which are difficult to realize. Because the input is matched, identical stages can be directly cascaded to achieve a higher gain. The power gain of the overall structure, as given by Equation 7, is a function of the number of FETs used. Some flexibility in the amount of power gain is available, however, as will be discussed below in relation to another embodiment.

III. Second Embodiment

FIG. 8 shows an alternative embodiment of an integrated amplifier circuit 90 according to the invention. Integrated amplifier circuit 90 is arranged to increase the gain available from the input signal in a given length of input transmission line 92.

Input or gate transmission line 92 is located in the center of integrated amplifier circuit 90, and is terminated in input terminating impedance and ground 98. Output or drain transmission line 94, on the other hand, consists of two branches 94a and 94b, each of which is parallel to gate transmission line 92. Each of the branches 94a and 94b is terminated by an output terminating impedance and ground 96a and 96b. Between gate transmission line 92 and branch 94a is a row 100a of FETs, and between gate transmission line 92 and branch 94b is another row 100b of FETs.

The FETs of FIG. 8 are arranged somewhat differently than those of FIG. 3. Specifically, each drain 102 is arranged between two gates 104a and 104b, and adjacent FETs are therefore the mirror image of each other, with some adjacent FETs sharing a drain 102 and others sharing a source 106. The sources 106 shown in FIG. 8 are somewhat more accurate in size in relation to the longitudinal width of the gates 104a and 104b and the drains 102 than those shown in FIG. 3.

The effect of locating each drain 102 between two gates 104a and 104b is to increase the power gain $G_p$ of the structure for the given length of gate line 92, since the resulting current in the drain transmission line 94 should be nearly doubled. The use of two branches 94a and 94b effectively doubles the power gain $G_p$ per unit length.

IV. Miscellaneous

It is projected that the integrated amplifier circuit of the invention will result in an amplifier which is several orders of magnitude smaller than conventional hybrid microwave amplifiers. Specifically, the integrated amplifier circuit may probably be fabricated monolithically in a 50 mil×100 mil area.

Although the integrated amplifier circuit of the invention can operate at all frequencies down to DC, as noted above, the most practical use of the integrated amplifier circuit of the invention is in the microwave frequency range. In this range, a broad bandwidth can be obtained.

The integrated amplifier circuit of the invention results in a significant power gain, but is not presently intended as a power amplifier. The input signal is likely to be less than ¼ watt and the output signal is likely to be less than 1 watt. Therefore, a loss in the terminating impedances should not result in a heat problem. If a heat problem develops, additional steps should be taken to provide heat sinks attached to the substrate 50.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A monolithic amplifier comprising:
   a semiconductor substrate having an upper surface and a conductive base layer;
   an integrated amplifier circuit disposed along the upper surface of the substrate, the amplifier circuit including input means for receiving a signal to be amplified from a signal source at one end, a plurality of successive amplifying stages including input and output stages at opposite ends for amplifying the signal received, and output means for providing the amplified signal to a load at the opposite end, each amplifier stage including a field effect transistor having a respective source, drain and gate on the surface of the substrate, and an underlying channel below said respective source, drain and gate, said gate controlling the conductivity of the respective channel between said source and drain, the respective gate being the input element of each stage connected to the input means, and the respective drain being the output element connected to the output means, said input and output means including a pair of spaced linear parallel conductive strips along opposite sides of said upper surface providing a pair of traveling wave input and output transmission lines having transverse connections to respective gates and drains of each successive stage;

an input terminating impedance means connected between the end of said input transmission line opposite said signal source and said conductive base layer; and an output terminating impedance means connected between the end of said output transmission line opposite said load and said conductive base layer, said input and output terminating impedance means being matched to the respective characteristic impedance of the input and output transmission lines to prevent reflections.

2. The amplifier of claim 1 in which the substrate comprises gallium arsenide.

3. The amplifier of claim 1 in which each of the amplifier stages includes a hole in the semiconductor layer of the substrate, each hole being between the respective source and the conductive base layer, each hole containing a conductive material for connecting the respective source to the conductive layer.

4. The amplifier of claim 3 in which the respective characteristic impedance of the output line is equal to the impedance of the load.

5. The amplifier of claim 3 in which the output transmission line has first and second branches spaced from a central input transmission line, the amplifier stages being arranged successively in first and second rows intermediate the input line and the respective first and second branches.

6. The amplifier of claim 3 in which the phase delay of the propagating signal along the input line between successive input elements is equal to the phase delay of the propagating amplified signal along the output line between the corresponding output elements.

7. The amplifier of claim 6 in which successive input elements are connected to the input line at a distance from each other equal to a distance between the connections of the corresponding output elements to the output line.

8. The amplifier of claim 7 in which the amplifying circuit of each amplifier stage includes a source element, the output drain element of each amplifier stage being adjacent the source element of the next successive amplifier stage, the source element of each stage being followed by the input gate element of that stage, the input gate element of each stage being followed by the output drain element of that stage, the amplifier stages being arranged in a row between the input and output lines.

* * * * *